United States Patent [19]
Garrett

[11] Patent Number: 4,959,535
[45] Date of Patent: Sep. 25, 1990

[54] OPTICAL RECEIVER CIRCUIT INCLUDING A FILTER NETWORK TO MINIMIZE NOISE

[75] Inventor: Ian Garrett, Ipswich, England

[73] Assignee: British Telecommunication, Great Britain

[21] Appl. No.: 418,976

[22] Filed: Oct. 10, 1989

Related U.S. Application Data

[63] Continuation of Ser. No. 314,760, filed as PCT GB88/00449 on Jun. 9, 1990, published as WO88/10034 on Dec. 15, 1988, abandoned.

[30] Foreign Application Priority Data

Jun. 11, 1987 [GB] United Kingdom ................. 8713699

[51] Int. Cl.$^5$ ............................................ H01J 40/14
[52] U.S. Cl. ............................. 250/214 R; 250/214 A
[58] Field of Search ........ 250/214 R, 214 A, 214 RC; 307/311

[56] References Cited

U.S. PATENT DOCUMENTS

| 3,755,762 | 8/1973 | Boulin et al. | 333/705 |
| 3,999,061 | 12/1976 | McLaughlin et al. | 25/214 R |
| 4,628,197 | 12/1986 | Thompson | 250/214 R |

FOREIGN PATENT DOCUMENTS 0215373  7/1987  European Pat. Off.

OTHER PUBLICATIONS

Journal of Lightwave Technology, vol. LT-4, No. 3, Mar. 1986 IEEE, (New York, U.S.), I. Garrett et al: "Theoretical Analysis of Heterodyne Optical Receivers for Transmission Systems Using (Semiconductor) Lasers With Nonnegligible Linewidth", pp. 324–334.

National Telecommunications Conference, Nov. 29–Dec. 3, 1981 New Orleans, Louisiana, IEEE, (New York), U.S.), H. H. Saupe: "On the Design of Receivers in Analog Lightwave Systems for Multichannel Transmission of Broadband Services", pp. B9.7.1–B9.7.4.

Kan, et al "Noise Performance of Gbit/s Turned Optical Receivers", Electronic Letters, Apr. 23, 1987, vol. 23, No. 9, pp. 434–435.

*Primary Examiner*—David C. Nelms
*Attorney, Agent, or Firm*—Nixon & Vanderhye

[57] ABSTRACT

A receiver circuit for receiving a modulated optical signal and for generating a corresponding electrical signal comprises a photodiode (1) for receiving the optical signal and for generating a first modulated electrical signal. An amplification circuit (3) receives the first electrical signal or a signal related thereto via an n stage (where n is an odd-integer) filter network (2) connected between the photodiode (1) and the amplification circuit (3). The output from the amplification circuit is fed to a first equalization amd noise filter (5). The characteristics of the filter network are such that the total thermal noise power output of the first noise filter is substantially minimized.

14 Claims, 4 Drawing Sheets

OPTICAL RECEIVER CIRCUIT INCLUDING A FILTER NETWORK TO MINIMIZE NOISE

This is a continuation of application Ser. No. 314,760, filed as PCT GB88/00449 on Jun. 9, 1990, published as WO88/10034 on Dec. 15, 1988, now abandoned.

The invention relates to a receiver circuit for receiving a modulated optical signal and for generating a corresponding electrical signal using an optical detector which behaves as a current source and to a method of constructing such a receiver circuit.

It is well known that optical receivers for direct detection systems can be made more sensitive by using an "integrating" design incorporating a large load resistor for the photodiode. Thus if S is the symbol rate, R the load resistor and $C_T$ the total capacitance of the front-end of the receiver, one chooses $R >> \frac{1}{2}\pi S C_T$ and one recovers the pulse wave-form subsequently by differentiating in a pre-equalising stage. The reason for doing this is that the receiver noise is then no longer dominated by the thermal noise of the load resistor. Instead it is dominated by the series noise of the pre-amplifier stage, i.e. by the channel noise in the case of an FET front-end and by the base and collector current shot noise in the case of a bipolar transistor front-end. This series noise source has an essentially white (constant) spectral density, so that after the differentiating pre-equaliser stage a dominant noise spectral density component proportional to frequency squared is produced. This noise spectral density component will be referred to as $f^2$ noise hereafter. Its effect on the receiver output noise power is kept under control by a low-pass filter (equaliser). If $B_{eq}$ is the bandwidth of the equaliser, the output noise power from this component is proportional to $B_{eq}^3$ and hence proportional to $S^3$ since the bandwidth of the equaliser is typically proportional to the data rate.

In a coherent optical receiver, it is desirable that the power of the local oscillator laser is large enough for the resulting shot noise to be much larger than any other noise components, particularly the thermal noise components of the receiver. This is also well known, and is called the "strong local oscillator" (SLO) condition. The local oscillator power needed to achieve the SLO condition depends, therefore, on the receiver thermal noise, and is larger at higher data rates. Because of technological problems with semiconductor lasers (the preferred laser type for communication systems), it is generally difficult to provide a strong local oscillator laser that has low phase noise and low excess intensity noise, particularly for large optical powers. This problem is aggravated in heterodyne receivers, particularly if they are designed to cope with substantial phase noise on the signal and local oscillator lasers. The reasons for this are explained below.

Receivers for homodyne detection may have a front-end design similar to that for a direct detection receiver, since the signal is at base-band after the mixing on the photodiode. The thermal noise is typically dominated by the $f^2$-noise component. However, receivers for heterodyne detection, in which the signal modulates an intermediate frequency carrier, require a band-pass design. For a given symbol rate, such a receiver must have at least twice the bandwidth of the corresponding direct detection receiver, and this bandwidth must be around the intermediate frequency $f_{IF}$ which is typically a few times the data rate. As a result, the output noise power due to the $f^2$-noise component is proportional, not to $B_{eq}^3$ but $6f_{IF}^2 B_{eq} + 2B_{eq}^3$. For example, if $f_{IF}$ is three times $B_{eq}$, the output thermal noise power is 56 times that of the corresponding direct detection receiver.

If the signalling format is frequency-shift keying (FSK) in which ZERO and ONE symbols are represented by two different optical frequencies, the receiver must have sufficient bandwidth to accept both signals. Alternatively, in so-called "single filter FSK" receivers, one frequency is filtered out, leaving what is essentially an amplitude-shift keyed (ASK) system. The bandwidth increase needed to receive full FSK depends on the frequency separation used. In the case where the two frequencies are well separated, the system is essentially two ASK systems, one of which is received with a higher intermediate frequency. The increase in receiver output thermal noise power could be by a factor of 7 to 8 typically. Against that, the signal power is increased by a factor of 4.

If the receiver must cope with substantial phase noise on the signal and local oscillator lasers, the bandwidth must be increased. As a rough guide, a bandwidth of twice the data rate plus ten times the total linewidth of the two lasers has been proposed by Salz as sufficient. Thus if the total linewidth is half the data rate (perhaps a little extreme), the receiver bandwidth must be increased by a factor 3.5. Usually that would mean using a higher intermediate frequency $f_{IF}$, so that the output thermal noise power is increased by a factor of perhaps 20.

It is likely that low-cost receivers will use non-synchronous demodulation of the signal on the intermediate frequency carrier, i.e. envelope detection or square-law detection. Such demodulation is only really effective if there are several (say at least 3) cycles of the carrier in each bit period, preferably more: a relatively high intermediate frequency is implied.

Thus the output noise power is increased by: (a) using heterodyne detection, (b) using FSK signalling format, (c) using lasers with significant phase noise, and (d) using non-synchronous demodulation at the intermediate frequency. The local oscillator power needed to approach the SLO condition is increased accordingly. However, it seems likely that a widely-used type of communication system will use all four of those factors, to reduce the cost.

Two modifications to the receiver design are known in the literature, each including an inductor in the front-end circuit to produce a resonance at or above the required maximum signal frequency. In each case the pre-equaliser is flat over the relevant frequency range. In the first modification, the inductor connects a photodiode to the gate of a FET, so that with the photodiode and gate-source capacitances a 3rd-order low pass filter is formed. If this filter is essentially flat over the required signal bandwidth, no pre-equaliser is needed. In the second modification, the inductor is in parallel with the photodiode and gate-source capacitances, forming a 1st-order band-pass filter centred around the frequency $f_i \frac{1}{2}\pi \sqrt{(LC_T)}$. Such a design has been used in a heterodyne receiver. The pre-equaliser takes the form of a first-order band-stop filter. Each design blocks a useful fraction of the noise from the series voltage noise source. Both these designs are effective over a rather narrow frequency band.

In accordance with one aspect of the present invention a receiver circuit for receiving a modulated optical signal and for generating a corresponding electrical signal comprises a photodetector acting as a current source for generating a first modulated electrical signal; an amplification circuit to which the first electrical signal or a signal related thereto is fed; a first noise filter; and an n stage (where n is an odd integer) filter network connected between the detector and the amplification circuit, the characteristics of the filter network being such that the total thermal noise power output of the first noise filter is substantially minimised.

In accordance with a second aspect of the present invention, a method of constructing a receiver circuit for receiving a modulated optical signal and for generating a corresponding electrical signal in which the circuit comprises a photodetector acting as a current source for generating a first modulated electrical signal; an amplification circuit to which the first electrical signal or a signal related thereto is fed; a first noise filter; and an n stage (where n is an odd integer) filter network connected between the detector and the amplification circuit, comprises selecting the components of the filter network such that the total thermal noise power output of the first noise filter is substantially minimised.

We have found that it is possible to design a receiver circuit which suppresses noise over a relatively wide frequency band by selecting the components of the filter network such that the total thermal noise power output of the first noise filter is substantially minimised. This has been achieved by devising an algorithm which defines the network components and then determining those component values which lead to a minimum thermal noise power output. Minimisation could be achieved analytically when n is low, but in most cases is more easily achieved using a one or multi-dimensional search routine on a computer.

For example, the thermal noise power $P_{n3}$ is a function of the thermal noise power spectral density ($n_3$) which is defined as $$n_3 = S_E |Im(1/H_{fe}(\omega))|^2$$

where $S_E$ is the serial voltage noise source originating from the amplification circuit, Im denotes the imaginary part, and $H_{fe}(\omega)$ is the transfer function of the detector, noise filter, and amplification circuit.

This invention should be contrasted with well-known filter designs such as Butterworth and Chebyshev in which the optimisation of the resonant frequencies is done in such a way as to achieve the objective of "optimally flat" response at the centre frequency of minimum ripple over the passband. In the invention, the criterion is to minimise the total thermal noise power output and so the precise details of the optimisation depend on the characteristics of the bandpass IF filter or low-pass noise filter.

The invention may have its greatest use in coherent heterodyne receivers, but may also be useful in direct detection and coherent homodyne receivers.

Some examples of receiver circuits in accordance with the present invention will now be described and contrasted with known circuits with reference to the accompanying drawings, in which.

Figure 1:
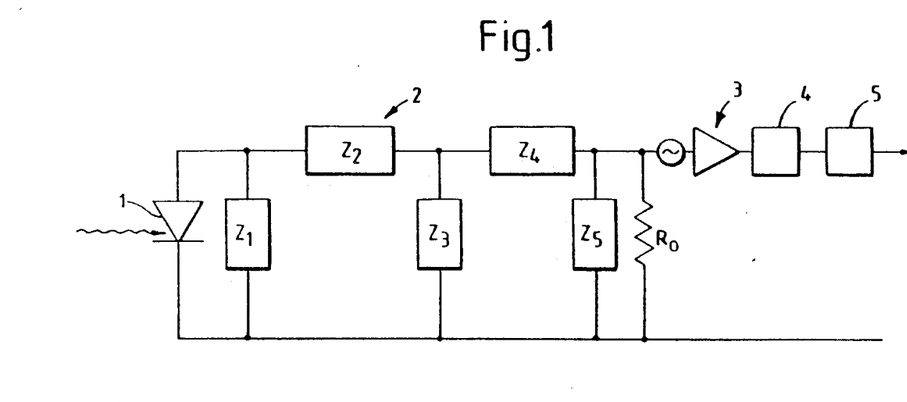
FIG. 1 is a generalised form (for n=5) of receiver circuit.

The circuit shown in FIG. 1 comprises a photodiode 1 connected to a filter network 2 which is connected to an amplification circuit 3 such as a field effected transistor or a bipolar transistor. The output from the amplification circuit 3 is fed to a pre-equalising circuit 4 which flattens the overall response of the receiver, the output of the pre-equalizer being fed to a first noise filter circuit 5 in the form of an IF bandpass filter circuit in a heterodyne receiver, or a low-pass filter in the case of homodyne or direct detection receivers.

The five stage filter network 2 shown in FIG. 1 is defined in its most generalised form by five impedances labelled $Z_1$–$Z_5$. The impedance $Z_1$ includes the parasitic or intrinsic capacitance of the photodiode 1 while the impedance $Z_5$ includes the parasitic or intrinsic capacitance of the amplifier input. The load resistance for the amplification circuit is denoted by $R_0$.

At this point we will define $$Z_5' = Z_5 // R_0 = \frac{R_0 Z_5}{Z_5 + R_0} \tag{1}$$

$$Z_3' = Z_3 // (Z_4 + Z_5') = \frac{Z_3(Z_4 + Z_5')}{Z_3 + Z_4 + Z_5'} \tag{2}$$

$$Z_3'' = Z_3 // (Z_1 + Z_2) = \frac{Z_3(Z_1 + Z_2)}{Z_1 + Z_2 + Z_3} \tag{3}$$

The transfer function of the receiver front-end is now simply (FIG. 1).

$$H_{fe}(\omega) \equiv \frac{V}{I} = \frac{Z_1 Z_3'}{Z_1 + Z_2 + Z_3'} \frac{Z_5'}{Z_4 + Z_5'} \tag{4}$$

and the equivalent noise power spectral densities at the input of the heterodyne/homodyne optical receiver front-end (FIG. 1) are $$n = n_1 + n_2 + n_3 \tag{5}$$

where $$n_1 = qP_L R \tag{6}$$

$$n_2 = \left(\frac{2k'\theta}{R_0} + S_I + \frac{S_E}{R_0^2}\right) R_0^2 |Re(1/H_{fe}(\omega))|^2 \tag{7}$$

$$n_3 = S_E \left| Im\left(\frac{1}{H_{fe}(\omega)}\right) \right|^2 \tag{8}$$

Here k' is Bolzman's constant, $\theta$ is the absolute temperature, R is the photo-diode responsivity, $S_I$ is the spectral density of the parallel current noise source of the amplifier and $S_E$ is spectral density of the serial voltage noise source originating from channel noise in the case of an FET front-end and base and collector current shot noise in the case of a bipolar transistor front-end. Im() denotes the imaginary part. $n_1$ is a white noise spectral density arising from the shot noise on the photocurrent due to the local oscillator power $p_L$, $n_2$, and $n_3$ are noise components from the receiver.

Based on Eqs. (6)–(8) and a given IF noise filter characteristic (FIG. 1) it is now possible to evaluate the noise power transmitted through the IF filter and by adjusting the impedances $Z_1$–$Z_5$ the noise power can be made as small as possible. This general design algorithm for the tuned front-end configuration will be applied in specific examples in the following.

No Tuning

For future reference we will derive the noise spectral densities $n_1$ to $n_3$ for the conventional receiver front-end where $Z_2 = Z_4 = 0, Z_3 = \infty, Z_1 = 1/j\omega C_1, Z_5 = j\omega C_2$ in the general diagram of FIG. 1.

In this case we obtain immediately $$n_1 = qp_L R \equiv N_1 T \quad (9)$$

$$n_2 = \left(\frac{2k'\theta}{R_0} + S_I + \frac{S_E}{R_0^2}\right) \equiv N_2 T \quad (10)$$

$$n_3 = \omega^2 C_T^2 S_E \equiv u^2 N_3 T^3 \quad (11)$$

where the normalised frequency u is defined as $$u = \frac{\omega T}{2\pi} \quad (12)$$

T is the bit-time. Later we will attempt to minimise the total noise power passed by a bandpass IF filter for different receiver front-end configurations assuming perfect equalisation in each case. At this point we will note that for common high-impedance receiver designs $n_1, n_3 >> n_2$ for all frequencies of interest. Since $n_1$ is due to a noise source in the photodiode, the influence of it cannot be adjusted by front-end tuning. We can only change the spectral dependence of $n_2$ and $n_3$. In the case with the normal front-end used in a heterodyne system with a large intermediate frequency (IF) and possibly a large IF filter bandwidth the influence of the '$u^2$' noise, (11), can be very significant and a large local oscillator power is required to make $n_1$,(9) dominant, i.e. to achieve shot noise limited detection.

The noise power passed by an IF filter with characteristic $H'(u) = H(\omega T/2\pi)$ is given in terms of normalised noise bandwidth integrals $$I_{2n+1} = \int_{-\infty}^{\infty} |H'(u)|^2 u^{2n} du, \quad n = 0 \pm 1, \pm 2, \ldots \quad (13)$$

The noise powers (in amp²) associated with eqs. (9)–(11) are now given by $$P_1 = N_1 I_1 \quad (14)$$

$$P_2{}^N = N_2 I_1 \quad (15)$$

$$P_3{}^N = N_3 I_3 \quad (16)$$

superscript 'N' means no tuning.

Figure 3:
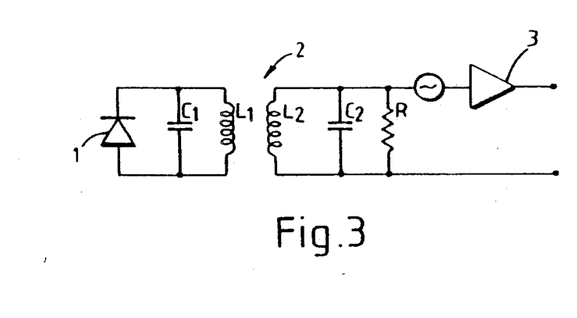
FIG. 3 illustrates a transformer-coupled circuit.

Transformer tuning (FIG. 3)

The transformer is specified via the inductance values $L_1, L_2$ and the coupling coefficient k (i.e. the mutual inductance is $L_m = k\sqrt{(L_1 L_2)}$). This gives $Z_1 = 1/j\omega C_1, Z_2 = j\omega(L_1 - L_m), Z_3 = j\omega L_m, Z_4 = j\omega(L_2 - L_m), Z_5 = 1/j\omega C_2$.

Using a similar process to that explained above, an expression for $n_3$ can be obtained and this can be used to optimise the components for minimum thermal noise using a two-dimensional computer search routine. The two variables available are the resonant frequency of the LC combinations and the coupling coefficient of the transformer. We have found that inductor values of 10 to 100 nH are appropriate for Gbit/s data rates, with a coupling coefficient of between 0.5 and 0.7.

Third Order Bandpass Filter

Figure 2:
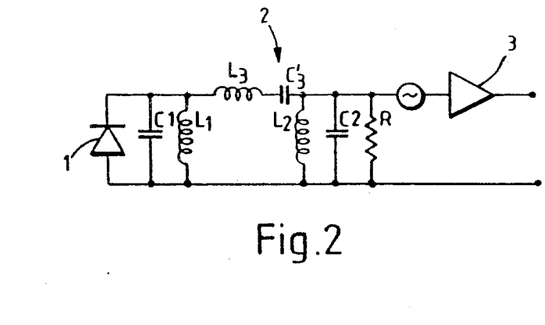
FIG. 2 illustrates one example of a third-order bandpass ladder filter.

FIG. 2 illustrates an example of a third-order bandpass ladder filter in which the tuning components are three inductors $L_1, L_s, L_2$ and a capacitance $C'_s$. This gives $Z_1 = j\omega L_1/(1 - \omega^2 L_1 C_1), Z_2 = 1/j\omega C^\circ{}_s(1 - \omega^2 L_s C'_s), Z_3 = \infty, Z_4 = 0, Z_5 = j\omega L_2/(1 - \omega^2 L_2 C_2)$.

Let u be frequency normalised to the data rate, $u_c$ be the resonant frequency of the LC combinations, and let H(u) be the transfer characteristic of the IF filter.

Using equation (13) and defining the modified bandwidth integrals:

$$\Gamma_3 = I_3 - 2u_c^2 I_1 + u_c^4 I_{-1}$$

$$\Gamma_5 = I_5 - 4u_c^2 I_3 + 6u_c^4 I_1 - 4u_c^6 I_{-1} + u_c^8 I_{-3}$$

and so on, with the usual binomial coefficients for the numerical factors. Then the total thermal receiver noise at the IF output can be minimised algebraically. If $n_3 >> n_2$, it is sufficient to minimise $P_{n3}$. Its minimum value is:

$$P_{th} = N_3[\Gamma_3 - \Gamma_5^2/\Gamma_7]$$

The optimum value for $u_c$ and hence for the front-end component values thus depend on the IF filter characteristic and are not obvious.

Figure 4:
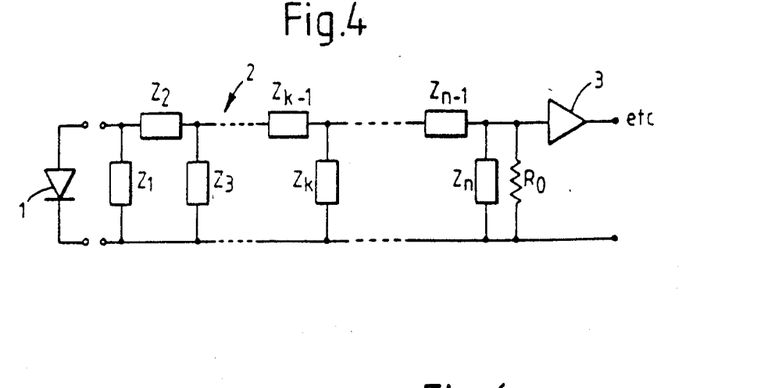
FIG. 4 illustrates a receiver circuit having an nth-order ladder filter.

A generalised definition for the transfer function $H_{fe}(\omega)$ of an n-th order ladder filter network can be derived by considering FIG. 4. The impedances $Z_1$ and $Z_n$ are the parasitic capacitances of the photodiode and of the FET gate-source, with parallel inductances in the general case. All other impedances are series LC or parallel LC combinations.

Let an impedance with a single prime represent the impedance in combination with everything to the right of it in the circuit. Then we can use an iterative definition:

$$Z'_n = \frac{Z_n R_0}{Z_n + R_0}$$

$$Z'_k = \frac{Z_k(Z_{k+1} + Z'_{k+2})}{Z_k + Z_{k+1} + Z'_{k+2}}$$

Then the transfer function for n stages is:

$$H_{fe}(\omega) = Z'_1 \frac{Z'_3}{Z'_2 + Z'_3} \frac{Z'_5}{Z'_4 + Z'_5} \ldots \frac{Z'_n}{Z'_{n-1} + Z'_n}$$

Mixed Tuning

We have found that the capacitor $C_2$ has a value below 1 pf in a design for data rates above several hundred Mbit/s. Eliminating this component results in what should be a low-pass filter, but it has a useful response around a high frequency, suitable for band pass use. The inductor values can be optimised by a two-dimensional computer search.

The table below gives the noise power of the receiver designs discussed above for two typical sets of photodiode and gate-source capacitance. The comparison is to a base-band (no tuning) design These noise powers are directly proportional to the required local oscillator power. It can be seen that the three designs considered all yield about a factor of 20 reduction in the required local oscillator powered compared to no tuning.

|  | Relative Noise Power | |
| --- | --- | --- |
|  | Case 1 | Case 2 |
| No tuning | 1.0 | 1.0 |
| 3rd Order | 0.049 | 0.065 |
| Mixed Tuning | 0.051 | 0.067 |
| Transformer | 0.046 | 0.058 |

It will be appreciated that the invention allows for the constraints of large load resistor and essentially fixed photodiode and gate-source capacitances to be taken into account as well as the characteristics of the IF filter and yields optimised components values.

Figure 5:
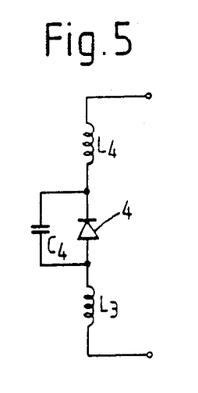
FIG. 5 is a schematic diagram of an equivalent circuit for a photodiode.
Figure 6:
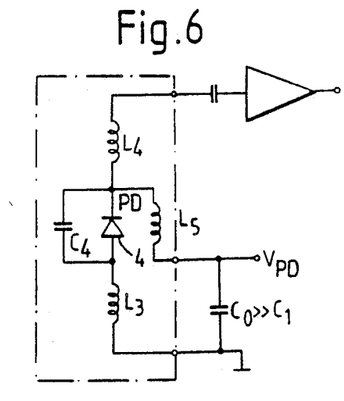
FIG. 6 is a schematic diagram of an example of a circuit according to the present invention incorporating the photodiode of FIG. 5.

Referring now to FIGS. 5 and 6 there is shown a practical T-equivalent of a transformer coupled front-end. The inductors have been realised directly as the photodiode bond-wires, and a micro-strip pre-amplifier is used. Even through the total parasitic capacitance of the front-end is 1.2 pF, we have obtained an r.m.s. noise current below 9 pA/$\sqrt{Hz}$ over a bandwidth of 2.4 GHz. This compares well with the 12 pa/$\sqrt{Hz}$ over a 3 GHz bandwidth obtained with a single serial inductor and parasitic capacitance of 0.6 pF reported by Gimlett JL. ("Low noise 8 GHz pin-FET optical receiver". Electron Lett vol 23 (1987) pp 281.283.)

The circuit employs a commercial photodiode 4 (RCA 30616CER) with a bandwidth specification of 1.6 GHz (rise and fall time of 0.3 ns), determined mainly by the inductance of the bond-wires and the junction capacitance as shown by the equivalent circuit at FIG. 5 with the equivalent inductors $L_3$ and $L_4$ and capacitance $C_4$.

Figure 7:
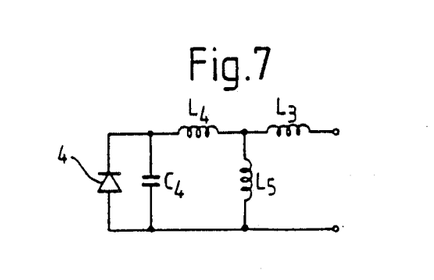
FIG. 7 is the noise equivalent circuit of the circuit of FIG. 6.
Figure 8:
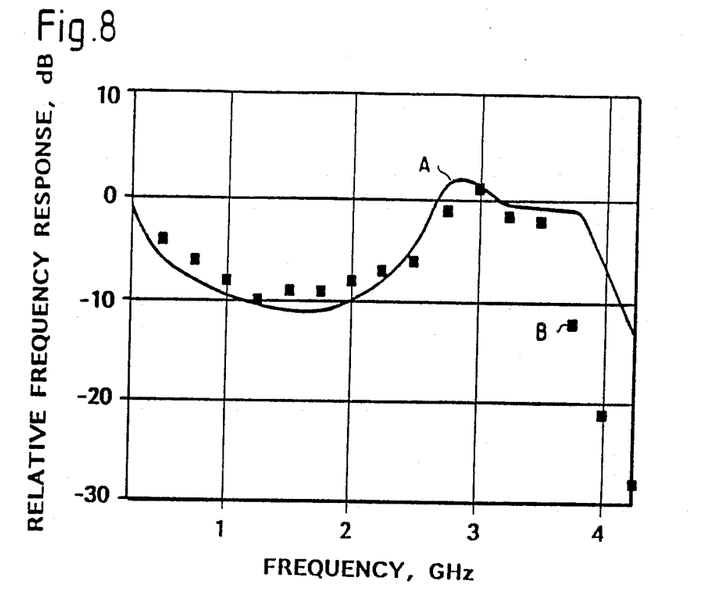
FIG. 8 is a graph is the frequency response of the optical receiver of FIG. 5.
Figure 9:
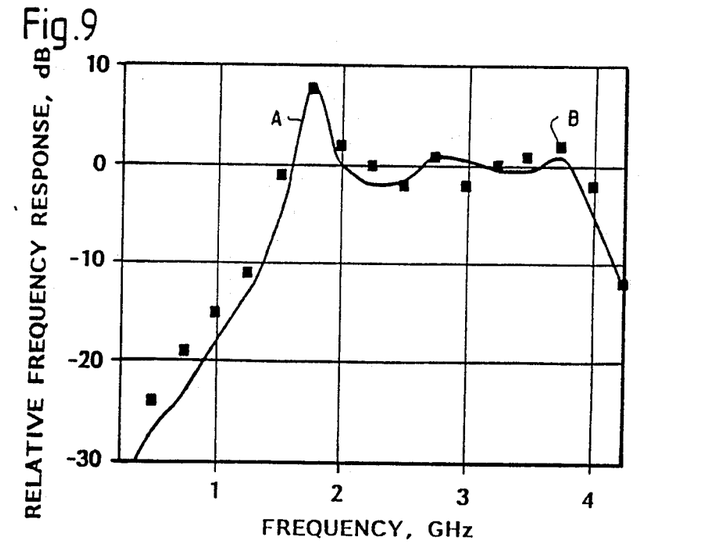
FIG. 9 is a graph of the frequency response of the optical receiver and front-end of FIG. 6.

By bonding an extra lead to the photodiode as shown in FIG. 6 we obtain the required three inductors with the a.c. diagram shown in FIG. 7. This front-end is connected to a two-stage high-impedance pre-amplifier using NE71083 GaAs FETs with interstage microwave matching networks to expand the bandwidth. FIGS. 8 and 9 shows the frequency responses obtained. FIG. 8 is for the receiver without the added bond-wire, with response limited by the photodiode parasitics. FIG. 9 is for the modified photodiode and front-end, showing improved response over a wider bandwidth.

Figure 10:
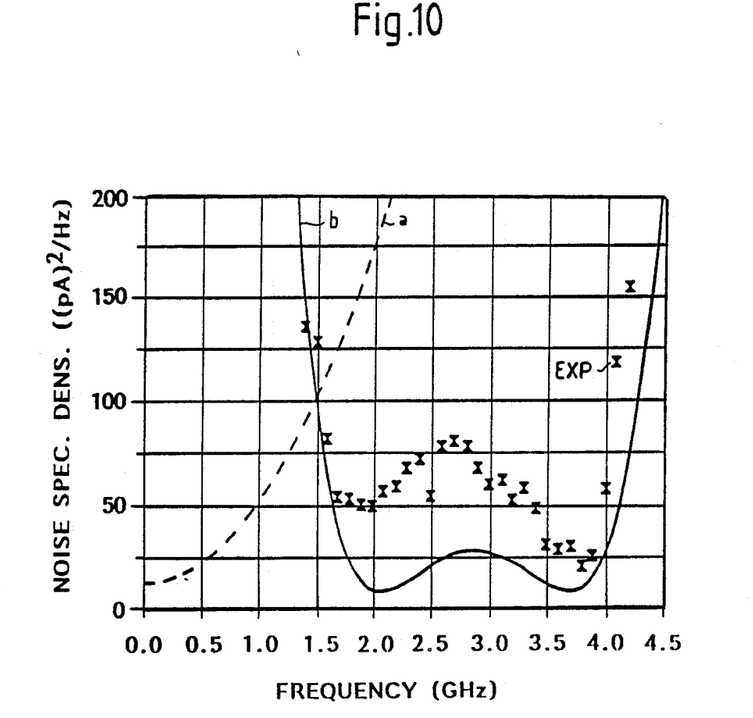
FIG. 10 is a graph of the theoretical and experimentally measured noise spectral densities or the tuned receiver of FIG. 6 plotted for comparison with the theoretical noise spectral density for a conventional receiver using the same basic components.

In FIG. 10 there are shown the measured results for the receiver thermal noise spectral density, assuming perfect equalisation, the theoretical curves for a base-band receiver (no front-end tuning) and for transformer tuning. Theoretically we would expect about 12 dB reduction in receiver thermal noise in the passband from 1.6 to 4.0 GHz, some 3.3 dB more than simple serial tuning and 5.7 dB more than parallel tuning. The experimental measurements agree generally with the predicted performance, but with higher noise spectral density in the lower frequency part of the passband. The stripline amplifier had excess noise in the frequency range 1.5 to 2.5 GHz which is not accounted for in the theoretical curves.

With this embodiment there is demonstrated a design for an optical heterodyne receiver front-end for Gbit/s data rates. Improved bandwidth response was obtained by modifying the commercial photodiode mount, with an added bond-wire to realise the T-equivalent of a transformer-coupling using a two-stage amplifier with interstage microwave matching, we have obtained an r.m.s. noise current below 9 pA/$\sqrt{Hz}$ in a bandwidth from 1.6 to 4.0 GHz. This result, which we believe to be the lowest reported result for a Gbit/s receiver, was obtained with a total parasitic capacitance in the front-end of 1.2 pF.

I claim:

1. A receiver circuit for receiving a modulated optical signal and for generating a corresponding electrical signal, the circuit comprising a photodetector acting as a current source for generating a first modulated electrical signal; an amplification circuit to which the first electrical signal or a signal related thereto is fed; a first noise filter; and an n stage (where n is an odd integer 3) filter network connected between the detector and the amplification circuit, the characteristics of the filter network being such that the total thermal noise power output of the first noise filter is substantially minimised.

2. A circuit according to claim 1 for direct detection of optical signals, wherein the first noise filter is a low-pass filter.

3. A circuit according to claim 1 for coherent homodyne detection of optical signals, wherein the first noise filter is a low-pass filter.

4. A circuit according to claim 1 for coherent heterodyne detection of optical signals, wherein the first noise filter is an IF bandpass filter.

5. A circuit according to claim 4, wherein the filter network comprises a third-order bandpass ladder filter.

6. A circuit according to claim 4, wherein the filter network includes a transformer.

7. A circuit according to any of the preceding claims, wherein the photodetector comprises a photodiode.

8. A circuit according to any one of the preceding claims 1, 2, 3, 4, 5, or 6 wherein the amplification circuit comprises an FET or bipolar transistor.

9. A method of constructing a receiver circuit for receiving a modulated optical signal and for generating a corresponding electrical signal in which the circuit comprises a photodetector acting as a current source for generating a first modulated electrical signal; an amplification circuit to which the first electrical signal or a signal related thereto is fed; a first noise filter; and an n stage (where n is an odd integer $\geq 3$) filter network connected between the detector and the amplification circuit, the method comprising selecting the components of the filter network such that the total thermal noise power output of the first noise filter is substantially minimised.

10. A method of constructing a receiver circuit for receiving a modulated optical signal and for generating a corresponding electrical signal in which the circuit comprises a photodetector acting as a current source for generating a first modulated electrical signal; an amplification circuit to which the first electrical signal or a signal related thereto is fed; a first noise filter; and an n stage (where n is an odd integer) filter network connected between the detector and the amplification circuit, the method comprising selecting the components of the filter network such that the total thermal noise power output of the first noise filter is substantially minimised wherein the receiver control circuit is constructed in accordance with any one of claims 2 to 6.

11. A method according to claim 9, wherein the total thermal noise power ($P_{n2}+P_{n3}$) is a function of the thermal noise power spectral densities ($n_2$ and $n_3$) which are defined as:

$$n_2 = \left(\frac{2k'\theta}{R_0} + S_I + \frac{S_E}{R_0^2}\right)R_0^2 \left(\left|Re\left(\frac{1}{(H_{fe}(\omega))}\right)\right|\right)^2$$

$$n_3 = S_E |Im(1/H_{fe}(\omega))|^2$$

where k' is Boltzmann's constant, $\theta$ is the absolute temperature, $R_0$ is the load resistance, $S_I$ and $S_E$ are the spectral densities of the parallel current noise source and the serial voltage noise source originating from the amplification circuit, Im and Re denote imaginary and real parts, and $H_{fe}(\omega)$ is the transfer function of the detector, filter network, and amplification network.

12. A method according to claim 11, wherein the receiver circuit is defined by five composite impedances $Z_1$-$Z_5$ where $Z_1$, $Z_3$, and $Z_5$ are positioned in parallel between the detector and the amplification circuit and $Z_2$ and $Z_4$ are positioned in series between $Z_1$, $Z_3$ and $Z_3$, $Z_5$ respectively, the transfer function $H_{fe}(\omega)$ being defined by the formula:

$$\frac{Z_1 Z_3'}{Z_1 + Z_2 + Z_3'} \frac{Z_5'}{Z_4 + Z_5'}$$

where $Z'_5$ represents the parallel combination of $Z_5$ and $R_0$, the load resistance of the amplification circuit, and $Z'_3$ represents the parallel combination of $Z_3$ and $(Z_4 + Z'_5)$.

13. A method according to claim 11, wherein the filter network comprises n stages, with transfer function:

$$H_{fe}(\omega) = Z'_1 \frac{Z'_3}{Z_2 + Z'_3} \frac{Z'_5}{Z_4 + Z'_5} \ldots \frac{Z'_n}{Z_{n-1} + Z'_n}$$

14. A method according to claim 9, wherein the component values for minimised thermal noise are determined using a computer search routine.

* * * * *

UNITED STATES PATENT AND TRADEMARK OFFICE
CERTIFICATE OF CORRECTION

PATENT NO. : 4,959,535

DATED : September 25, 1990

INVENTOR(S) : Ian Garrett

It is certified that error appears in the above-identified patent and that said Letters Patent is hereby corrected as shown below:

Column 8, line 32 (claim 1), should read:

--noise filter; and an n stage (where n is an odd integer $\geq 3$)--

Signed and Sealed this

Twenty-fourth Day of November, 1992

Attest:

DOUGLAS B. COMER

*Attesting Officer*    Acting Commissioner of Patents and Trademarks